United States Patent
Yang

(10) Patent No.: US 11,764,793 B2
(45) Date of Patent: Sep. 19, 2023

(54) CIRCUIT AND CALIBRATION METHOD OF ALL-DIGITAL PHASE-LOCKED LOOP CIRCUIT

(71) Applicant: Realtek Semiconductor Corp., HsinChu (TW)

(72) Inventor: Yu-Che Yang, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 17/699,164

(22) Filed: Mar. 20, 2022

(65) Prior Publication Data

US 2022/0311447 A1    Sep. 29, 2022

(30) Foreign Application Priority Data

Mar. 24, 2021   (TW) ................................. 110110645

(51) Int. Cl.
*H03L 7/099* (2006.01)
*H03L 7/085* (2006.01)
*G04F 10/00* (2006.01)

(52) U.S. Cl.
CPC .......... *H03L 7/0991* (2013.01); *G04F 10/005* (2013.01); *H03L 7/085* (2013.01); *H03L 2207/50* (2013.01)

(58) Field of Classification Search
CPC .... H03L 2207/50; H03L 7/085; H03L 7/0991
See application file for complete search history.

(56) References Cited

U.S. PATENT DOCUMENTS

| | | |
|---|---|---|
| 7,148,758 B1 | 12/2006 | Ross |
| 2009/0212876 A1* | 8/2009 | Kobayashi ............ H03L 7/0991 331/1 A |
| 2012/0176169 A1* | 7/2012 | Sinha ................... H03L 7/1075 327/156 |
| 2017/0214409 A1* | 7/2017 | Kondo ..................... H04B 1/38 |
| 2019/0268008 A1* | 8/2019 | Khoury ................ H03L 7/0991 |

FOREIGN PATENT DOCUMENTS

TW    I364169 B1    5/2012

OTHER PUBLICATIONS

Robert Bogdan Staszewski, John L.Wallberg, Sameh Rezeq, Chih-Ming Hung, Oren E. Eliezer, Sudheer K. Vemulapalli, Chan Fernando, Ken Maggio, Roman Staszewski, Nathen Barton, Meng-Chang Lee, Patrick Cruise, Mitch Entezari, Khurram Muhammad, Dirk Leipold, "All-Digital PLL and Transmitter for Mobile Phones", JSSC, Dec. 2005,IEEE, USA.

* cited by examiner

*Primary Examiner* — Ryan Johnson
(74) *Attorney, Agent, or Firm* — Winston Hsu

(57) ABSTRACT

An all-digital phase-locked loop (ADPLL) circuit and a calibration method thereof are provided. The ADPLL circuit includes a digitally controlled oscillator (DCO) circuit, a phase detector circuit, and a calibration circuit coupled between the DCO circuit and the phase detector circuit. The DCO circuit generates a clock signal according to a frequency control signal. The phase detector circuit generates a phase error value according to a reference signal and the clock signal. More particularly, after the ADPLL circuit performs a locking operation for a period of time, the frequency control signal is tied at a locked value which is obtained when the ADPLL circuit performs the locking operation, and the calibration circuit may modify a current of at least one current source within the DCO circuit according to the phase error value.

12 Claims, 5 Drawing Sheets

CIRCUIT AND CALIBRATION METHOD OF ALL-DIGITAL PHASE-LOCKED LOOP CIRCUIT

BACKGROUND OF THE INVENTION

1. Field of the Invention

The present invention is related to all-digital phase-locked loops (ADPLLs), and more particularly, to a circuit (e.g., a circuit comprising an ADPLL circuit) and a calibration method of an ADPLL circuit.

2. Description of the Prior Art

In an all-digital phase-locked loop (ADPLL), a digitally controlled oscillator (DCO) may be required. This DCO may significantly impact the performance of the whole ADPLL. More particularly, phase noise of the DCO is typically the most important index/metrics. In order to optimize an overall performance of the ADPLL, there is a need for a novel ADPLL and an associated calibration method which can optimize the circuit architecture with respect to the phase noise of the DCO.

SUMMARY OF THE INVENTION

An objective of the present invention is to provide a circuit and a calibration method of an all-digital phase-locked loop (ADPLL), in order to optimize the circuit architecture with respect to phase noise of a digitally controlled oscillator (DCO) circuit, and thereby improve the overall performance of the circuit (e.g., the circuit comprising the ADPLL circuit) without introducing any side effect or in a way that is less likely to introduce side effects.

At least one embodiment of the present invention provides a circuit which comprises an ADPLL circuit, wherein the ADPLL circuit may comprise a DCO circuit, a phase detector circuit, and a calibration circuit coupled between the DCO circuit and the phase detector circuit. The DCO circuit may be configured to generate a clock signal according to a frequency control signal, and the phase detector circuit may be configured to generate a phase error value according to a reference signal and the clock signal. More particularly, after the ADPLL circuit performs a locking operation for a period of time, the frequency control signal is tied or fixed at a locked value which is obtained when the ADPLL circuit performs the locking operation, and the calibration circuit modifies a current of at least one current source within the DCO circuit according to the phase error value.

At least one embodiment of the present invention provides a calibration method of an ADPLL circuit, wherein the calibration method may comprise: utilizing the ADPLL circuit to perform a locking operation for a period of time, in order to make a frequency control signal of a DCO circuit of the ADPLL circuit converge to a locked value; fixing the frequency control signal at the locked value, to make the DCO circuit generate a clock signal according to the locked value; utilizing a phase detector circuit of the ADPLL circuit to generate a phase error value according to a reference signal and the clock signal; and utilizing a calibration circuit of the ADPLL circuit to modify a current of at least one current source within the DCO circuit according to the phase error value.

The circuit provided by the embodiments of the present invention can utilize a calibration circuit therein to calculate an index value corresponding to phase noise of the DCO circuit, in order to stepwise find a bias current which can minimize the phase noise. In comparison with the related art, the embodiments of the present invention will not greatly increase additional costs. Thus, the present invention can optimize the circuit architecture with respect to phase noise of the DCO circuit, and thereby improve the overall performance of the ADPLL circuit without introducing any side effect or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
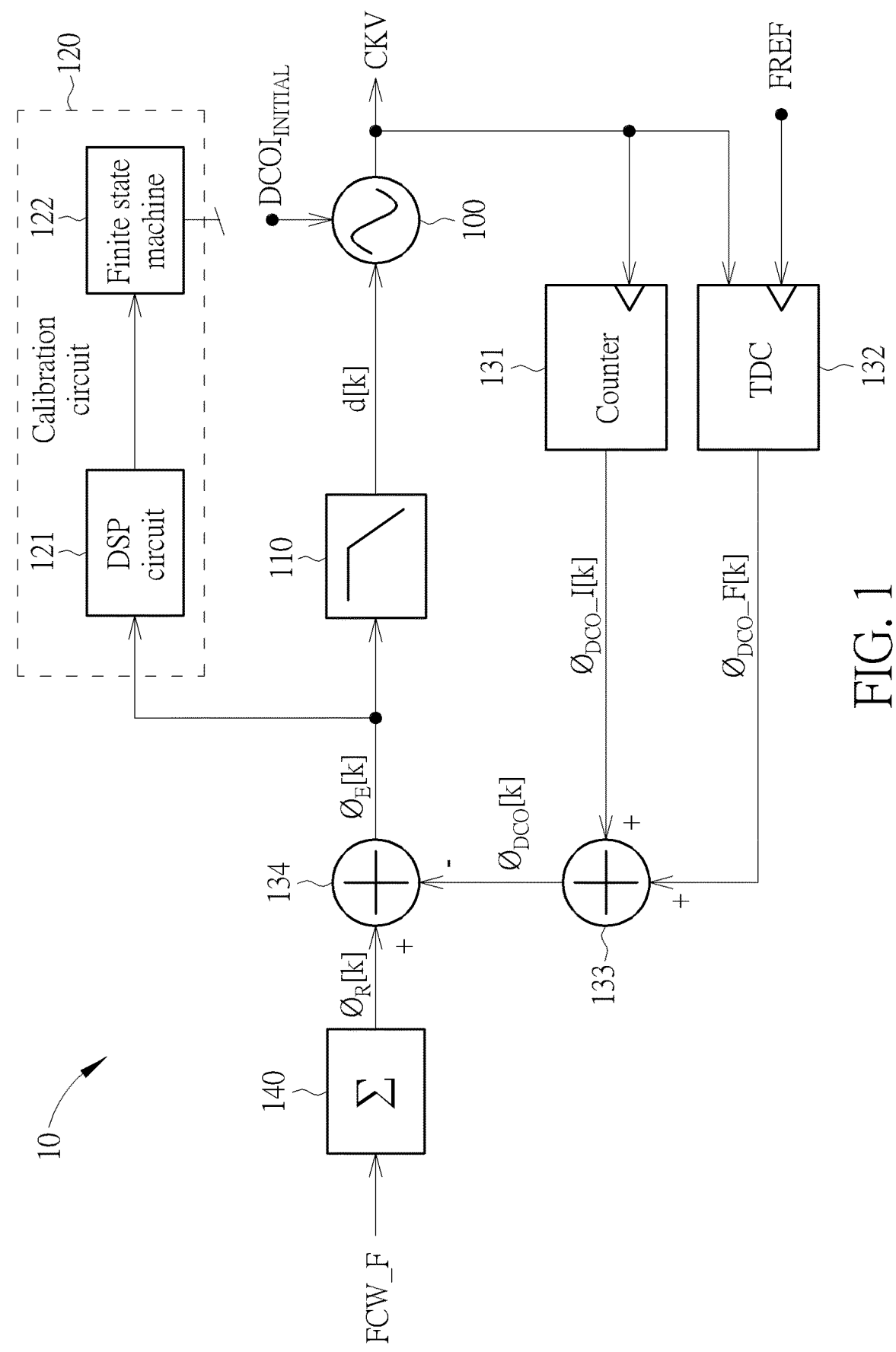
FIG. 1 is a diagram illustrating an all-digital phase-locked loop (ADPLL) circuit performing a locking operation according to an embodiment of the present invention.
Figure 2:
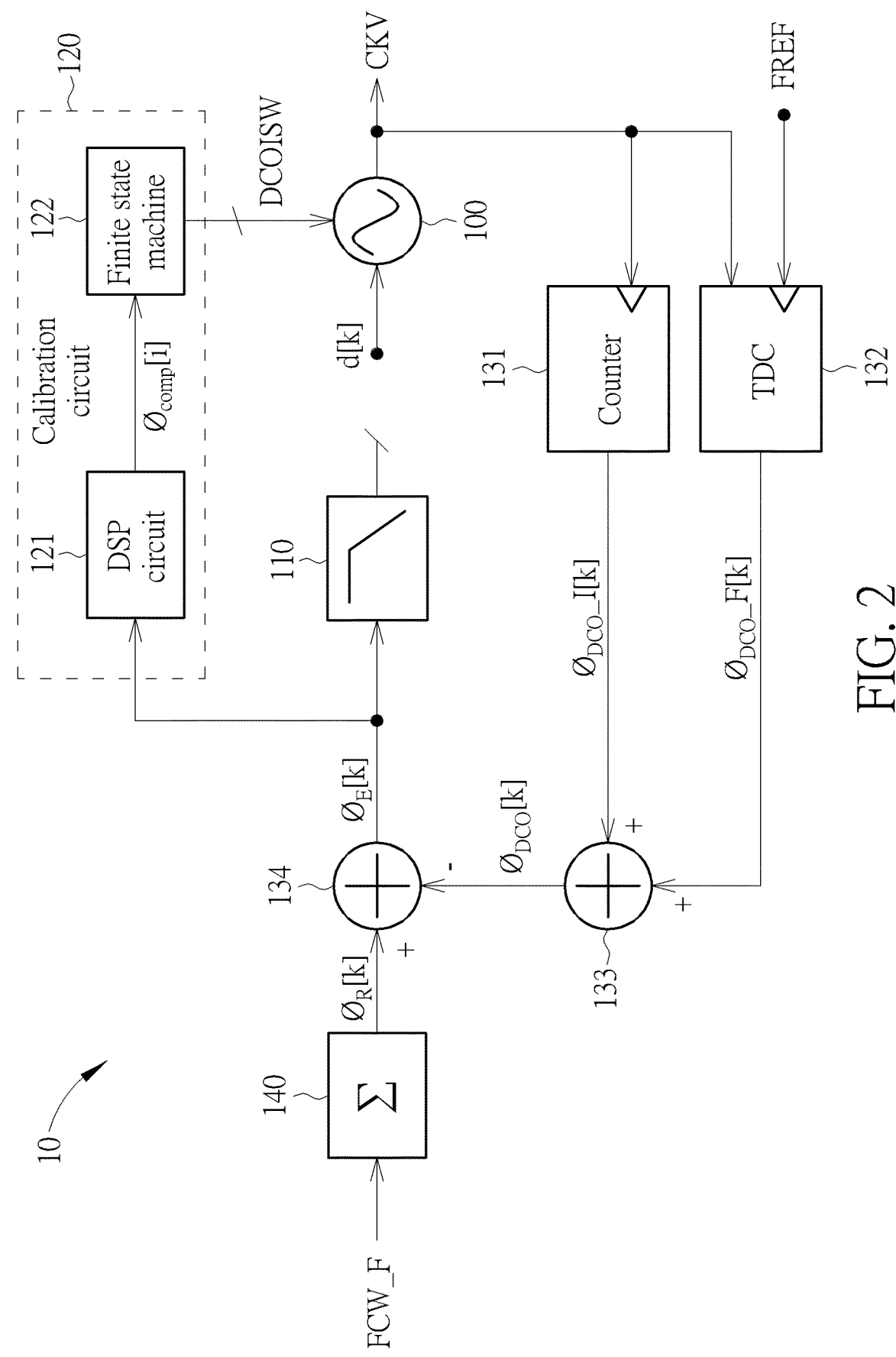
FIG. 2 is a diagram illustrating an ADPLL circuit performing calibration according to an embodiment of the present invention.

FIG. 1 is a diagram illustrating an all-digital phase-locked loop (ADPLL) 10 performing a locking operation according to an embodiment of the present invention, wherein the ADPLL circuit 10 may be included in a circuit or an electronic device. FIG. 2 is a diagram illustrating the ADPLL circuit 10 performing calibration according to an embodiment of the present invention. As shown in FIG. 1 and FIG. 2, the ADPLL circuit 10 may comprise a digitally controlled oscillator (DCO) circuit 100, a phase detector circuit, a filter 110 (e.g., a digital low pass filter) and a calibration circuit 120. For brevity, the DCO circuit 100 is illustrated by a circle with a sine wave therein, and the filter 110 is illustrated by a box with a low pass frequency response waveform therein.

As shown in FIG. 1, when the ADPLL circuit 10 performs the locking operation, a signal for controlling a current of at least one current source of the DCO circuit 100 such as a bias current source thereof may be temporarily tied or fixed at an initial value $DCOI_{INITIAL}$, which makes the current of the bias current source be tied at an initial current. At this moment, a control path from the calibration circuit 120 to the DCO circuit 100 is disabled. Taking a time point k as an example (e.g., a $k^{th}$ cycle of a reference signal FREF, where k is a positive integer), the DCO circuit 100 may generate a clock signal CKV according to a frequency control signal (e.g., a value d[k]), where when the ADPLL circuit 10 performs the locking operation, the frequency control signal is from the filter 110. In addition, the phase detector circuit may generate a phase error value $\emptyset_E[k]$ according to the reference signal FREF and the clock signal CKV, and the filter 110 may perform filtering on the phase error value $\emptyset_E[k]$ to generate the frequency control signal.

In this embodiment, the phase detector circuit may calculate a frequency ratio between a frequency of the reference signal FREF and a frequency of the clock signal CKV, and compares the frequency ratio with a reference ratio FCW_F to generate the phase error value $Ø_E[k]$. For example, the phase detector circuit may comprise a counter 131, a time-to-digital converter (TDC) 132, and multiple calculating units 133 and 134 (which are illustrated by circles with "+" therein for brevity). The counter 131 may calculate an integer portion $Ø_{DCO\_I}[k]$ of the frequency ratio (e.g., by detecting how many cycles of the clock cycles are there in one cycle of the reference signal FREF). The TDC 132 may calculate a fractional portion $Ø_{DCO\_F}[k]$ of the frequency ratio (e.g., calculating the fractional portion $Ø_{DCO\_F}[k]$ according to a time difference $\Delta t_r$ between a rising edge of the reference signal FREF and a rising edge of the clock signal CKV and a time difference $\Delta t_f$ between the rising edge of the reference signal FREF and a falling edge of the clock signal CKV). In addition, the calculating unit 133 may accumulate the frequency ratio $Ø_{DCO\_I}[k]+Ø_{DCO\_F}[k]$ cycle by cycle (e.g., along with cycles of the reference signal FREF) to generate an accumulated result $Ø_{DCO\_}[k]$, and an accumulator 140 (which is labeled "Σ" in figures for brevity) may accumulate the reference ratio FCW_F cycle by cycle (e.g., along with cycles of the reference signal FREF) to generate an accumulated result $Ø_R[k]$, where the calculating unit 134 may calculate a difference between the accumulated results $Ø_{DCO\_}[k]$ and $Ø_R[k]$ to generate the phase error value $Ø_E[k]$, but the present invention is not limited thereto.

Referring to FIG. 2, assuming that the ADPLL circuit 10 has performed the locking operation for a period of time (e.g., in the $k^{th}$ cycle of the reference signal FREF) and reaches a steady state (e.g., a change amount of the frequency control signal becomes less than a predetermined threshold as time goes by), the loop may be disconnected, and the frequency control signal FREF may be tied at a locked value such as d[k] which is obtained when the ADPLL circuit 10 performs the locking operation (more particularly, at a time point at which the loop reaches the steady state). Thus, the DCO circuit 100 may generate the clock signal CKV based on the locked value d[k] which is tied, and the calibration circuit 120 may modify the current of the bias current source within the DCO circuit 100 according to the phase error value $Ø_E[k]$ under this condition. As shown in FIG. 2, the control path from the calibration circuit 120 to the DCO circuit 100 is enabled at this moment, where the signal for controlling the current of the bias current within the DCO circuit 100 is no longer tied at the initial value $DCOI_{INITIAL}$, but is instead controlled by an N-bit control signal DCOISW provided by the calibration circuit 120. For example, the calibration circuit 120 may generate the control signal DCOISW according to the phase error $Ø_E[k]$, in order to modify the current of the bias current of the DCO circuit 100 by switching the control signal DCOISW. As the operation of the remaining circuits (e.g., the phase detector circuit and the accumulator 140) in the embodiment of the present invention is similar to the embodiment of FIG. 1, and is therefore omitted here for brevity.

In this embodiment, the calibration circuit 120 may perform calculation on the phase error $Ø_E[k]$ to obtain an index value (e.g., $Ø_{comp}[i]$ may be configured to represent an $i^{th}$ index value which is obtained at which the calibration is performed, where i is a positive integer), and modifies the current of the bias current source (e.g., a switchable current ISW) of the DCO circuit 100 in order to minimize the index value (e.g., in order to find a value of the switchable current ISW which is able to minimize the index value), where the index value corresponds to phase noise of the DCO circuit 100. As shown in FIG. 2, the calibration circuit 120 may comprise a digital signal processing (DSP) circuit 121 and a finite state machine 122, where the finite state machine 122 is coupled to the DSP circuit 121. In particular, the DSP circuit 121 may perform calculation on the phase error value $Ø_E[k]$ to obtain the index value, and the finite state machine 122 may modify the switchable current ISW according to a change of the index value, in order to minimize the index value. For example, the calibration circuit 120 (e.g., the finite state machine 122 therein) may sequentially switch the switchable current ISW to multiple candidate current values, in order to sequentially obtain corresponding index values, and the calibration circuit 120 (e.g., the finite state machine 122 therein) may select a candidate current value which corresponds to a minimum index value from these candidate current values to be a final current value. In another example, the calibration circuit 120 (e.g., the finite state machine 122 therein) may stepwise approach a candidate current value which corresponds to the minimum index value by a binary search, in order to take this candidate current value as the final current value. After the above calibration is finished, the control path from the calibration circuit 120 to the DCO circuit 100 may be disabled again, and a signal path from the filter 110 to the DCO circuit 100 may be enabled again, in order to make the ADPLL circuit 10 proceed with the locking operation, where the phase noise of the DCO circuit 100 has been reduced via the aforementioned current modifying mechanism, and therefore an overall performance of the ADPLL circuit 10 is improved.

Figure 3:
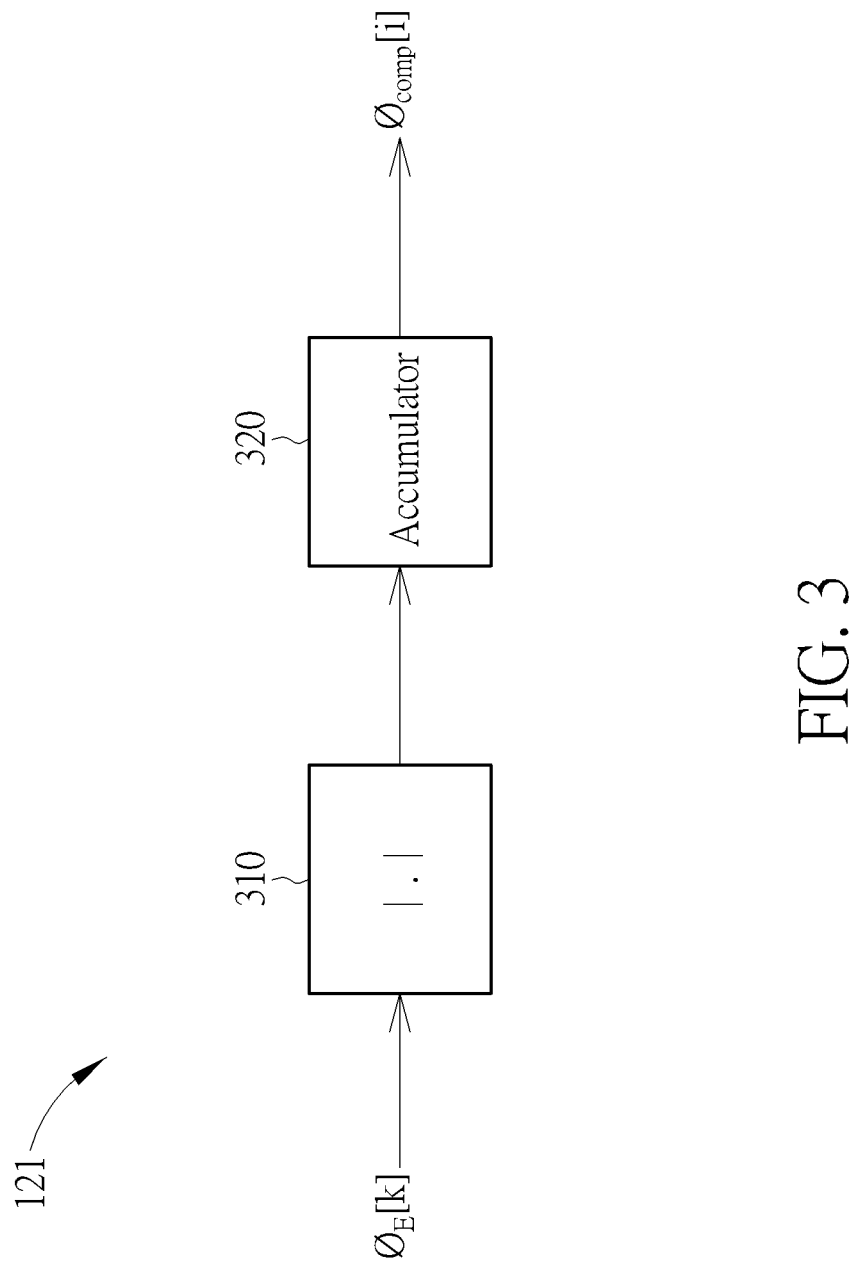
FIG. 3 is a diagram illustrating a digital signal processing circuit according to an embodiment of the present invention.

As the ADPLL circuit 10 has performed the locking operation for a period of time and reaches the steady state before performing the calibration, a frequency of the clock signal CKV is substantially equal to a target frequency (e.g., FCW_F times the frequency of the reference signal FREF) under a condition where the frequency control signal is tied at the locked value d[k]. As the DCO circuit 100 has the phase noise, the frequency of the clock signal CKV may vary around the target frequency (e.g., varying up and down with the target frequency as an average). Similarly, phase error values at different time points (e.g., the phase error values $Ø_E[k]$, $Ø_E[k+1]$ $Ø_E[k+2]$, . . . and $Ø_E[k+n]$ respectively at $k^{th}$, $(k+1)^{th}$, $(k+2)^{th}$, . . . and $(k+n)^{th}$ cycle of the reference signal FREF, where n is a positive integer) may vary around accumulation results of the reference ratio FCW_F at these time points, respectively (e.g., varying up and down with $Ø_R[k]$, $Ø_R[k+1]$, $Ø_R[k+2]$, . . . and $Ø_R[k+n]$ as an average, respectively). In order to generate the index value such as $Ø_{comp}[i]$ which is able to represent the phase noise, the DSP circuit 121 may accumulate an absolute value of the phase error value for a period of time in order to generate the index value. For example, the DSP circuit 121 may sum absolute values of the phase error values $Ø_E[k]$, $Ø_E[k+1]$, $Ø_E[k+2]$, . . . and $Ø_E[k+n]$ at the $k^{th}$, $(k+1)^{th}$, $(k+2)^{th}$, . . . and $(k+n)^{th}$ cycle of the reference signal FREF to obtain $Ø_{comp}[i]$ (e.g., $Ø_{comp}[i]=|Ø_E[k]|+|Ø_E[k+1]|+|Ø_E[k+2]|+ \ldots +|Ø_E[k+n]|$). As shown in FIG. 3, the DSP circuit 121 performing the above calculation may comprise an absolute value calculating circuit 310 (labeled "|•|" for brevity) configured to generate the absolute value of the phase error value at respective time points. The DSP circuit 121 may further comprise an accumulator 320 coupled to the absolute value calculating circuit 310, which is configured to sum these absolute values to generate the index value such as $Ø_{comp}[i]$.

Figure 4:
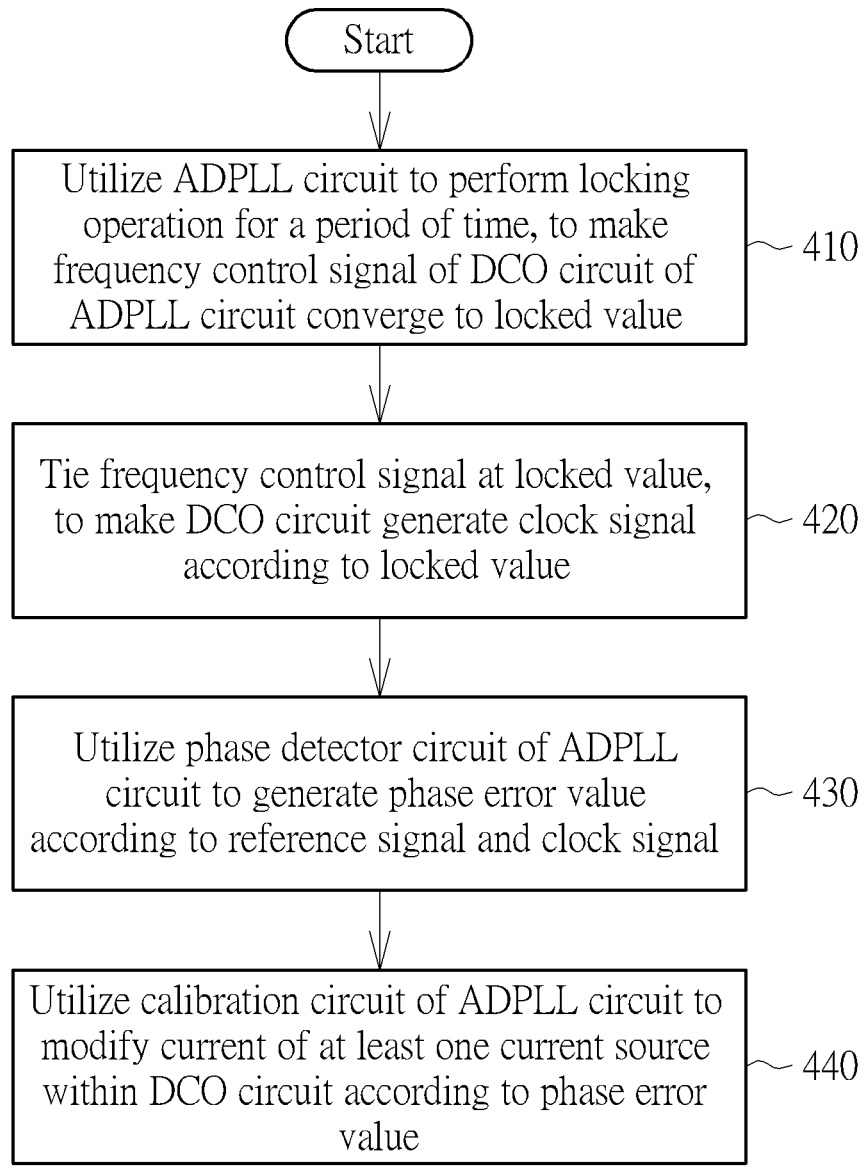
FIG. 4 is a diagram illustrating a flowchart of a calibration method of an ADPLL circuit according to an embodiment of the present invention.

FIG. 4 is a diagram illustrating a flowchart of a calibration method of an ADPLL circuit according to an embodiment of the present invention, where the calibration method is applicable to the ADPLL circuit 10. In addition, as long as an overall result is not hindered, one or more steps may be added, deleted or modified in the working flow shown in FIG. 4, and these steps do not have to be executed in the exact order shown in FIG. 4.

In Step 410, the ADPLL circuit 10 may perform a locking operation for a period of time, to make a frequency control signal of the DCO circuit 100 of the ADPLL circuit 10 converge to a locked value (e.g., d[k] shown in FIG. 1 and FIG. 2).

In Step 420, the frequency control signal may be tied or fixed at the locked value, to make the DCO circuit 100 generate a clock signal (e.g., CKV shown in FIG. 2) according to the locked value.

In Step 430, a phase detector circuit of the ADPLL circuit 10 (e.g., the counter 131, the TDC 132, and the calculating units 133 and 134) may generate a phase error value (e.g., $\emptyset_E[k]$ shown in FIG. 2) according to a reference signal (e.g., FREF shown in FIG. 2) and the clock signal.

In Step 440, the calibration circuit 120 of the ADPLL circuit 10 may modify a current of at least one current source (e.g., the switchable current ISW mentioned above) within the DCO circuit 100 according to the phase error value.

Figure 5:
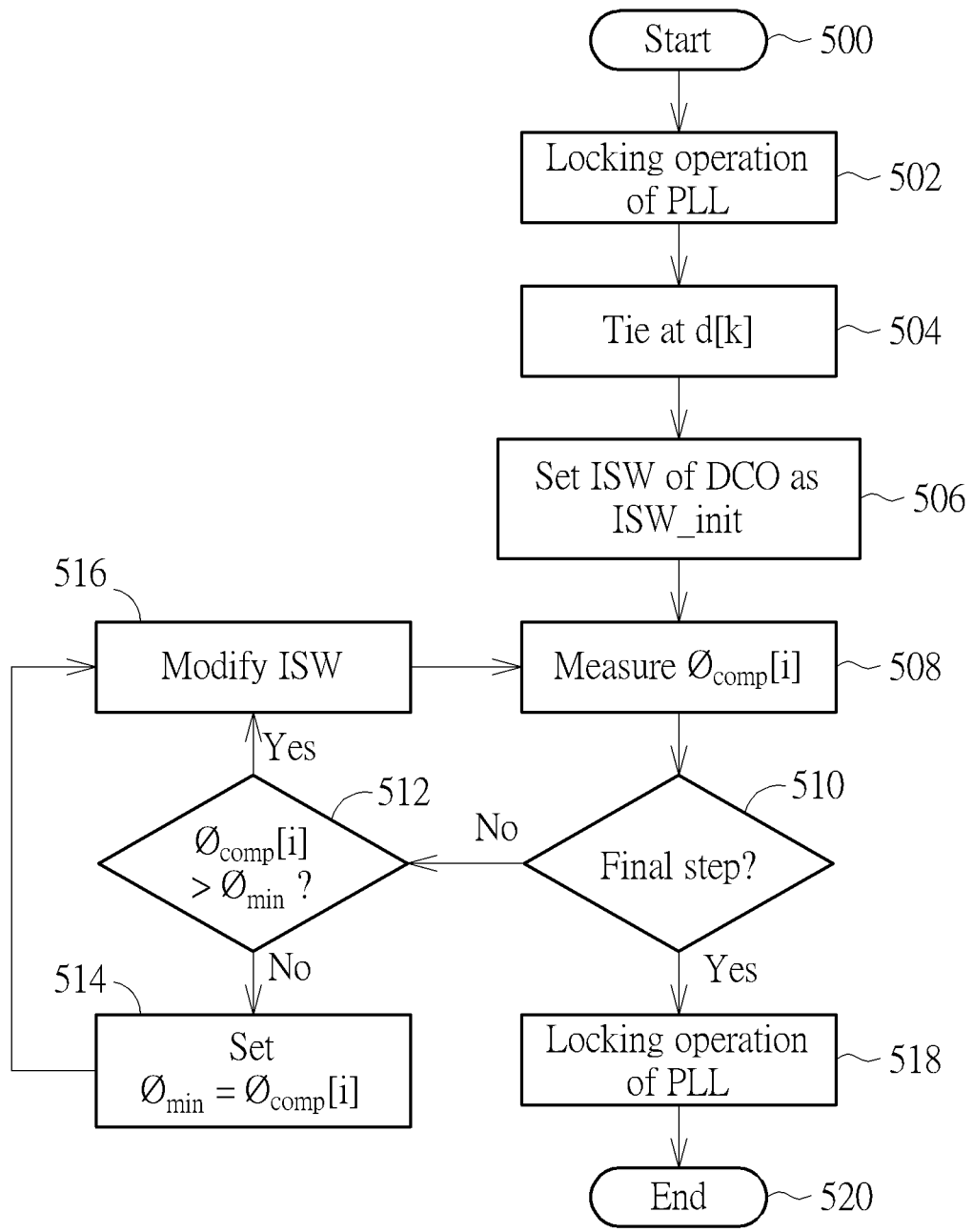
FIG. 5 is a diagram illustrating an example of the calibration method shown in FIG. 4 according to an embodiment of the present invention.

FIG. 5 is a diagram illustrating an example of the calibration method shown in FIG. 4 according to an embodiment of the present invention. As long as an overall result is not hindered, one or more steps may be added, deleted or modified in the working flow shown in FIG. 5, and these steps do not have to be executed in the exact order shown in FIG. 5.

In Step 500, the flow starts.

In Step 502, the ADPLL circuit 10 may normally perform a locking operation of a phase-locked loop (PLL).

In Step 504, the frequency control signal may be tied at d[k].

In Step 506, the calibration circuit 120 may set the value of the switchable current ISW of the DCO circuit 100 as ISW_init.

In Step 508, the calibration circuit 120 may calculate and measure the index value $\emptyset_{comp}[i]$.

In Step 510, the calibration circuit 120 (e.g., the finite state machine 122 therein) may determine whether the current step is a final step. If the determination result shows "Yes", the flow proceeds with Step 518; if the determination result shows "No", the flow proceeds with Step 512.

In Step 512, the calibration circuit 120 (e.g., the finite state machine 122 therein) may determine whether the index value $\emptyset_{comp}[i]$ is greater than a current minimum index value $\emptyset_{min}$ (labeled "$\emptyset_{comp}[i] > \emptyset_{min}$?" for brevity). If the determination result shows "Yes", the flow proceeds with Step 516; if the determination result shows "No", the flow proceeds with Step 514.

In Step 514, the calibration circuit 120 (e.g., the finite state machine 122 therein) may update the minimum index value $\emptyset_{min}$ as $\emptyset_{comp}[i]$ (labeled "Set $\emptyset_{min} = \emptyset_{comp}[i]$").

In Step 516, the calibration circuit 120 (e.g., the finite state machine 122 therein) may update the control signal DCOISW to modify the value of the switchable current ISW, and the flow returns to Step 508.

In Step 518, the ADPLL circuit 10 may proceed to execute the locking operation of the phase-locked loop.

In Step 520, the flow ends.

To summarize, the embodiments of the present invention utilize a phase detector circuit existing in an ADPLL circuit to serve as a component which detects phase noise of a DCO circuit, and utilize a calibration circuit to iteratively modify a bias current inside the DCO circuit according to the detected result, in order to optimize the bias current regarding performance related to the phase noise. The embodiments of the present invention will not greatly increase additional costs. Thus, the present invention can optimize the circuit architecture with respect to the phase noise of the DCO circuit, and thereby improves the overall performance of the ADPLL circuit without introducing any side effect or in a way that is less likely to introduce side effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit comprising:
   an all-digital phase-locked loop (ADPLL) circuit comprising:
   a digitally controlled oscillator (DCO) circuit configured to generate a clock signal according to a frequency control signal;
   a phase detector circuit configured to generate a phase error value according to a reference signal and the clock signal; and
   a calibration circuit coupled between the DCO circuit and the phase detector circuit;
   wherein after the ADPLL circuit performs a locking operation for a period of time, the frequency control signal is tied at a locked value which is obtained when the ADPLL circuit performs the locking operation, and the calibration circuit modifies a current of at least one current source within the DCO circuit according to the phase error value;
   wherein the calibration circuit performs calculation on the phase error value to obtain an index value, and modifies the current of the at least one current source in order to minimize the index value, wherein the index value corresponds to phase noise of the DCO circuit.

2. The circuit of claim 1, wherein the calibration circuit comprises:
   a digital signal processing (DSP) circuit configured to perform calculation on the phase error value to obtain the index value; and
   a finite state machine, coupled to the DSP circuit configured to modify the current of the at least one current source according to a change of the index value in order to minimize the index value.

3. The circuit of claim 2, wherein the DSP circuit accumulates an absolute value of the phase error value to generate the index value.

4. The circuit of claim 1, wherein the phase detector circuit calculates a frequency ratio between a frequency of the reference signal and a frequency of the clock signal, and compares the frequency ratio with a reference ratio to generate the phase error value.

5. The circuit of claim 4, wherein the phase detector circuit comprises a counter for calculating an integer portion of the frequency ratio.

6. The circuit of claim 4, wherein the phase detector circuit comprises a time-to-digital converter (TDC) for calculating a fractional portion of the frequency ratio.

7. A calibration method of an all-digital phase-locked loop (ADPLL) circuit, comprising:

utilizing the ADPLL circuit to perform a locking operation for a period of time, in order to make a frequency control signal of a digitally controlled oscillator (DCO) circuit of the ADPLL circuit converge to a locked value;

fixing the frequency control signal at the locked value, to make the DCO circuit generate a clock signal according to the locked value;

utilizing a phase detector circuit of the ADPLL circuit to generate a phase error value according to a reference signal and the clock signal; and utilizing a calibration circuit of the ADPLL circuit to modify a current of at least one current source within the DCO circuit according to the phase error value;

wherein the step of utilizing the calibration circuit of the ADPLL circuit to modify the current of the at least one current source within the DCO circuit according to the phase error value comprises:

utilizing the calibration circuit to perform calculation on the phase error value to obtain an index value, and modifying the current of the at least one current source in order to minimize the index value, wherein the index value corresponds to phase noise of the DCO circuit.

8. The calibration method of claim 7, wherein the step of utilizing the calibration circuit of the ADPLL circuit to modify the current of the at least one current source within the DCO circuit according to the phase error value comprises:

utilizing a digital signal processing (DSP) circuit within the calibration circuit to perform calculation on the phase error value to obtain the index value; and utilizing a finite state machine within the calibration circuit to modify the current of the at least one current source according to a change of the index value, in order to minimize the index value.

9. The calibration method of claim 8, wherein the step of utilizing the DSP circuit within the calibration circuit to perform calculation on the phase error value to obtain the index value comprises:

utilizing the DSP circuit to accumulate an absolute value of the phase error value to generate the index value.

10. The calibration method of claim 7, wherein the step of utilizing the phase detector circuit of the ADPLL circuit to generate the phase error value according to the reference signal and the clock signal comprises:

utilizing the phase detector circuit to calculate a frequency ratio between a frequency of the reference signal and a frequency of the clock signal, and comparing the frequency ratio with a reference ratio to generate the phase error value.

11. The calibration method of claim 10, wherein the step of utilizing the phase detector circuit to calculate the frequency ratio between the frequency of the reference signal and the frequency of the clock signal comprises:

utilizing a counter of the phase detector circuit to calculate an integer portion of the frequency ratio.

12. The calibration method of claim 10, wherein the step of utilizing the phase detector circuit to calculate the frequency ratio between the frequency of the reference signal and the frequency of the clock signal comprises:

utilizing a time-to-digital converter (TDC) of the phase detector circuit to calculate a fractional portion of the frequency ratio.

* * * * *